(12) United States Patent
Curatola et al.

(10) Patent No.: US 8,637,375 B2
(45) Date of Patent: Jan. 28, 2014

(54) METHOD OF MANUFACTURING A TUNNEL TRANSISTOR AND IC COMPRISING THE SAME

(75) Inventors: Gilberto Curatola, Korbek-Lo (BE); Marcus J. H. Van Dal, Heverlee (NL)

(73) Assignee: NXP B.V., Eindhoven (NL)

( * ) Notice: Subject to any disclaimer, the term of this patent is extended or adjusted under 35 U.S.C. 154(b) by 239 days.

(21) Appl. No.: 13/133,204

(22) PCT Filed: Oct. 12, 2009

(86) PCT No.: PCT/IB2009/054463
§ 371 (c)(1), (2), (4) Date: Jun. 7, 2011

(87) PCT Pub. No.: WO2010/067214
PCT Pub. Date: Jun. 17, 2010

(65) Prior Publication Data
US 2011/0241103 A1 Oct. 6, 2011

(30) Foreign Application Priority Data
Dec. 8, 2008 (EP) ..................................... 08105950

(51) Int. Cl.
*H01L 21/336* (2006.01)

(52) U.S. Cl.
USPC ........... 438/306; 438/285; 438/300; 257/288; 257/327; 257/343; 257/392; 257/510; 257/E27.009; 257/E21.409; 257/E29.255; 257/E29.13

(58) Field of Classification Search
USPC ................... 257/288, 327, 343, 392, 47, 510, 257/E27.099, E21.409, E29.255, E29.13; 438/306, 285, 300
See application file for complete search history.

(56) References Cited

U.S. PATENT DOCUMENTS

2006/0258072 A1   11/2006   Kavalieros et al.
2007/0178650 A1    8/2007   Chen et al.

FOREIGN PATENT DOCUMENTS

EP    1 901 354 A1    3/2008
KR    100622675 B1    9/2006

OTHER PUBLICATIONS

Choi, Woo Young, et al; "Tunneling Field-Effect Transistors (TFETs) With Subthreshold Swing (SS) Less Than 60 mV/dec"; IEEE Electron Device Letters, vol. 28, No. 8; IEEE Service Center, New York, NY, US; pp. 743-745 (Aug. 1, 2007).
International Search Report for Application PCT/IB2009/054463 (Feb. 17, 2010).

(Continued)

*Primary Examiner* — Meiya Li

(57) ABSTRACT

A method of manufacturing a tunnel field effect transistor is disclosed. The method comprises forming a two-step profile in a silicon substrate (100) using a patterned hard mask (104) covering the higher steps of said profile; forming a gate stack (114, 116) against the side wall of the higher step; forming spacers (122) on either side of the gate stack (118); and implanting a first type impurity (124) in the higher step and an opposite type impurity in the neighboring lower step (120), wherein at least the first type impurity is implanted using an angled implanting step after removing the patterned hard mask (104). In a preferred embodiment, the method further comprises forming a sacrificial spacer (108) against a side wall of a higher step and the side wall of the hard mask (104); further etching the lower step (106, 110) next to said spacer (108) and subsequently growing a further semiconductor portion (112) on said lower step and removing the spacer (108) prior to forming the gate stack. Further disclosed is an IC comprising tunnel transistors manufactured in accordance with this method.

10 Claims, 6 Drawing Sheets

(56) References Cited

OTHER PUBLICATIONS

Figure 2:
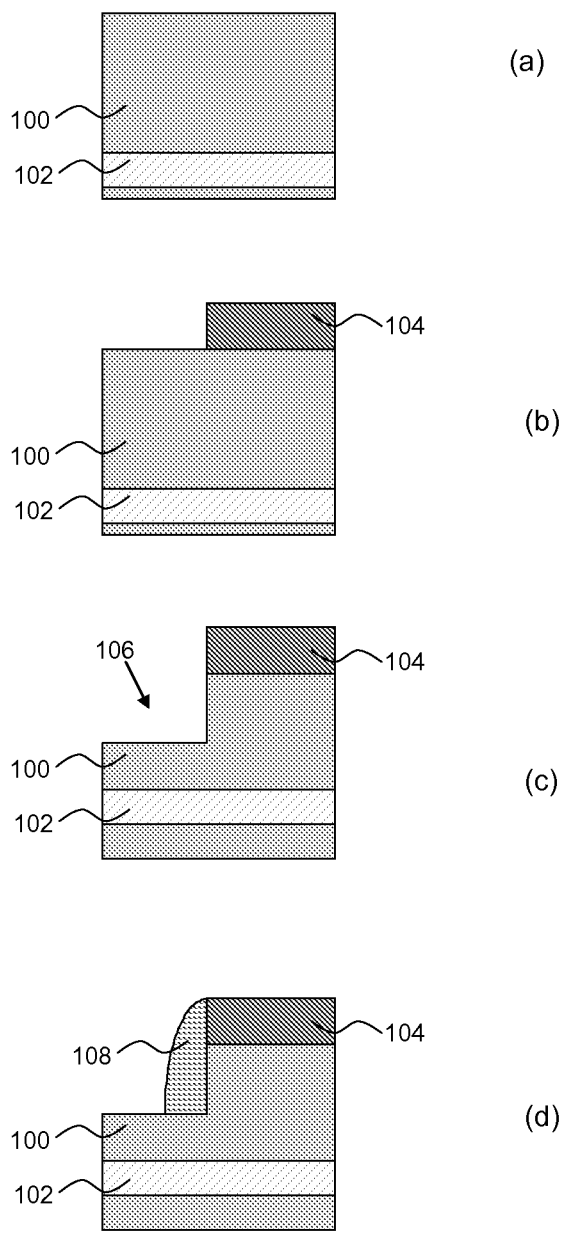
Figure 2:
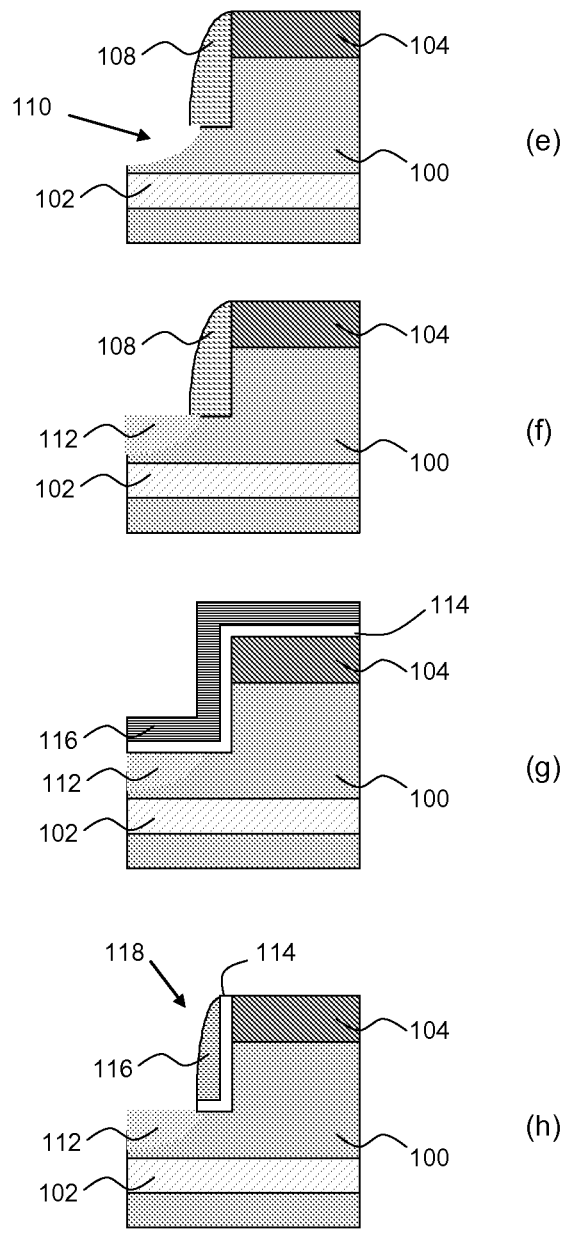
Figure 2:
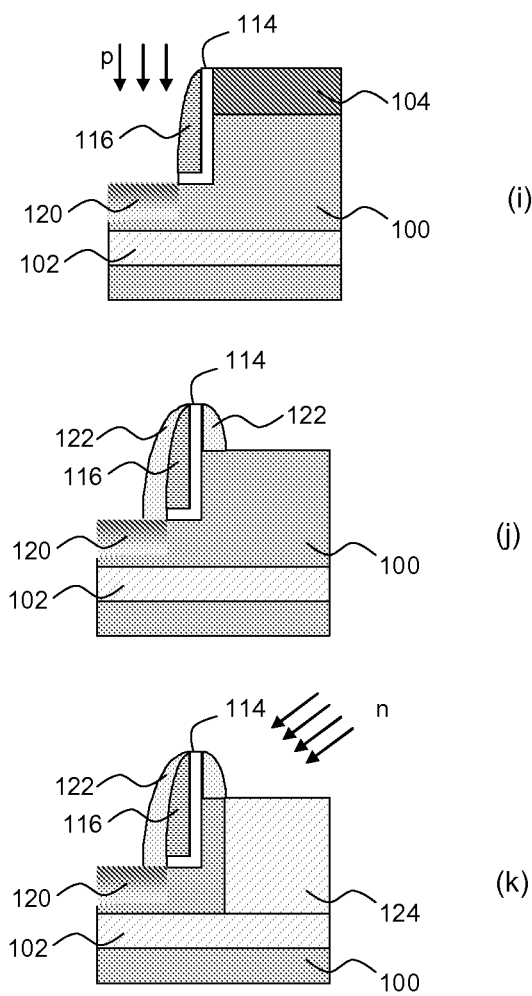

Bjork, M. T. et al. "Silicon Nanowire Tunneling Field-Effect Transistors", IEEE Applied Physics Letters 92, 193504, 3 pgs (2008).

Nirschl, T. et al. "The Tunneling Field Effect Transistor (TFET) as an Add-On for Ultra-Low-Voltage Analog and Digital Processes", IEEE International Electron Devices Meeting, pp. 195-198 (2004).

Nirschl, T. et al. "The 65nm tunneling field effect transistor (TFET) 0.68µm$^2$ 6T memory cell and multi-$V_{th}$ device", IEEE Proceeding of 35$^{th}$ European Solid-State Device Research Conference, pp. 173-176 (2005).

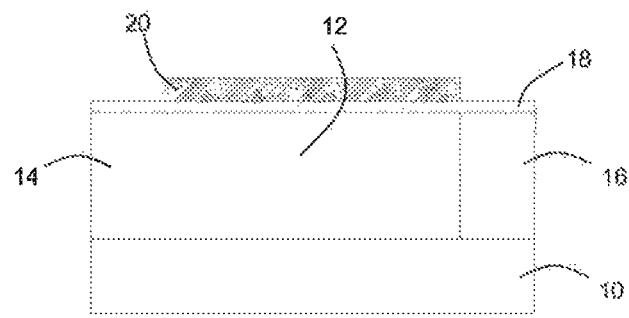
Fig. 1    (Prior Art)
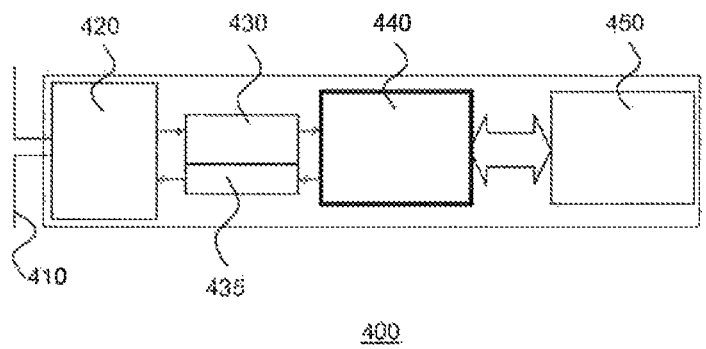
Fig. 4

METHOD OF MANUFACTURING A TUNNEL TRANSISTOR AND IC COMPRISING THE SAME

FIELD OF THE INVENTION

The present invention relates to a method of manufacturing a tunnel transistor.

The present invention further relates to an integrated circuit (IC) comprising a tunnel transistor manufactured in accordance with this method.

BACKGROUND OF THE INVENTION

The downscaling of semiconductor devices such as complementary metal oxide semiconductor (CMOS) field effect transistors (FETs) into the sub-micron domain and beyond, e.g. into the sub-100 nm domain, is not without problems. One of these problems is that the shrinking dimensions of the MOSFETs are accompanied by an increase in undesirable device characteristics such as short channel effects, poor current drive and leakage currents, which limit the application domains in which such devices can be used. For instance, the high leakage current prohibits use of such small transistors in low power applications, unless additional measures are included in the transistor design to reduce these undesirable effects, which add to the complexity and cost of the IC manufacturing process.

For this reason, other device architectures have been investigated to determine if these architectures are better equipped to handle device requirements in the sub-micron domain. Such architectures include multi-gate devices, gate-all-around nanowires and tunnel and impact ionization transistors. Especially tunnel transistors appear to be promising candidates for such application domains because they do not suffer from short-channel effects and have an extremely low off-state current. Moreover, due to the fact that the main carrier transport in their off-state comprises a tunneling mechanism through a potential barrier rather than thermionic emission over a potential barrier, a very steep transition from their off-state to their on-state may be achieved. Sub-threshold slope values of less than 10 mV/decade have already been reported, which is a considerable improvement over the optimum value that can be achieved with bulk transistors, which is approximately 60 mV/decade. In addition, due to the fact that the on-current of a tunnel transistor is only weakly dependent of the gate length, tunnel transistors are far less sensitive to variations in the lithography than MOSFETs. An example of a tunnel FET is disclosed in EP 1 901 354 A1.

One of the drawbacks of tunnel transistors such as tunnel FETs is that their current drive capability is less than that of conventional transistors such as MOSFETs. However, it has been recently demonstrated that the use of semiconductor materials other than silicon, e.g. germanium (Ge) or silicon-germanium (SiGe), can significantly improve performance of a tunnel transistor because the thickness of the tunnel barrier is significantly reduced when using such lower bandgap materials. This makes such tunnel transistors interesting candidates for low power application domains because good drive currents can be achieved in combination with low leakage currents in the off state of the device.

Another example of a known tunnel FET is shown in FIG. 1. A substrate 10 comprises a source region 14 that is heavily doped with a p-type impurity (i.e. a $p^+$ region) and a drain region 16 that is heavily doped with an n-type impurity (i.e. a $n^+$ region). A lightly doped p-type channel region 12 ((i.e. a $p^-$ region) is located between regions 12 and 14, and is separated from a gate electrode 20 by a gate dielectric layer 18. Such a tunnel FET is also known as a p-i-n device due to the insulating nature of the $p^-$ channel region 12. In operation, a tunnel barrier is formed at the source region 14 when a positive voltage is applied to the gate electrode 20, thus forming an inversion layer extending the $n^+$ drain region 16 deep into the $p^+$ source region 14. This inversion layer creates a potential energy barrier that can be tunneled by the electrons in the channel region 12.

A drawback of such tunnel transistors is that the asymmetric implant required to define the p-i-n structure of the tunnel transistor makes it difficult to achieve very small gate lengths due to limitations in the alignment accuracy during the masking and lithographic processes. This negatively affects the integration density for such devices. In addition, the manufacturing of such tunnel transistors generally requires more process steps compared to the manufacturing of conventional transistors, such that tunnel transistors are typically more costly to manufacture.

SUMMARY OF THE INVENTION

The present invention seeks to provide an improved method of manufacturing a tunnel electrode.

The present invention further seeks to provide an IC comprising tunnel transistors manufactured in accordance with the method of the present invention.

In accordance with a first aspect of the present invention, there is provided a method of manufacturing a tunnel field effect transistor, comprising forming a two-step profile in a silicon substrate using a patterned hard mask covering the higher steps of said profile; forming a gate stack against the side wall of the higher step; forming spacers on either side of the gate stack; and implanting a first type impurity in the higher step and an opposite type impurity in the neighboring lower step, wherein at least the first type impurity is implanted using an angled implanting step after removing the patterned hard mask.

Such a method allows for the formation of a tunnel transistor using a single mask only, thus significantly reducing the cost of the manufacturing process of such a transistor. In addition, due to fact that the alignment of this hard mask does not require a great detail of precision, a mask may be chosen that can be implemented at little cost.

In a preferred embodiment, the method of the present invention further comprises forming a sacrificial spacer against a side wall of a higher step and the side wall of the hard mask following said two-step profile formation; further etching the lower step of the two-step profile next to said spacer and subsequently growing a further semiconductor portion on said lower step; and removing the sacrificial spacer prior to the gate stack formation. Preferably, the further semiconductor portion comprises Ge or SiGe. Such a further semiconductor portion has the advantage that the drive current of the tunnel transistor is improved.

In an embodiment, a layer of a first type impurity may be buried in the substrate prior to using said hard mask to create a reverse polarized $p^+/n^+$ structure in an off state of the transistor, thus reducing the off-current of the transistor.

In an alternative embodiment, the silicon substrate is a silicon-on-insulator substrate, which has the benefit of further reducing the off-state current of the tunnel transistor.

The two-step profile may be formed by isotropically etching an unmasked substrate portion, such as a dry silicon etch. The lower step may be further etched by an anisotropic etching step, such as a Si dry/wet etch. Such an etch step will undercut the formed spacer such that the effective channel length of the tunnel transistor is reduced.

When manufacturing the tunnel transistor using a single mask only, the step of forming the gate stack comprises depositing a gate dielectric layer over the substrate and the patterned hard mask; depositing a further layer for forming a conductive gate over the gate dielectric layer; and isotropically etching the gate dielectric layer and the further layer to form the gate structure against the side walls of the higher step and the hard mask; wherein the opposite type impurity is implanted into the lower step after said gate stack formation; and wherein the hard mask is removed after implanting the opposite type impurity and before forming the spacers on either side of the gate stack.

In this embodiment, the hard mask is used to protect the higher step from the impurity implant into the lower step and the gate spacer on the side of the higher step is used to shield the lower step from the angled impurity implant into the higher step. Such an angled impurity implant is also known as a tilted implant.

In an alternative embodiment, the tunnel transistor is manufactured using an additional mask. In this embodiment, the hard mask is removed prior to the gate stack formation, and wherein forming said gate stack comprises depositing a gate dielectric layer over the substrate; depositing a further layer for forming a conductive gate over the gate dielectric layer; depositing a further hard mask over the further layer; patterning the hard mask to define the dimensions of the gate stack; and isotropically etching the portions of the further layer and the gate dielectric layer that are uncovered by the patterned hard mask, and wherein both the first type impurity and the opposite type impurity are implanted using respective angled implanting steps.

In this embodiment, the gate spacers provide the shadowing for higher and lower steps during the respective angled implants.

According to a further aspect of the present invention, there is provided an integrated circuit comprising a silicon substrate comprising a two-step profile defining a tunnel field effect transistor, said transistor comprising a first conductive region on a higher step of said two-step profile, said first conductive region comprising an impurity of a first conductivity type; a second conductive region on the lower step of said two-step profile, said second conductive region comprising an impurity of a second conductivity type; and a gate structure between the first conductive region and the second conductive region, said gate structure covering the side wall of the higher step.

Such an IC may be manufactured in accordance with the method of the present invention, and for instance has the benefit of reduced cost compared to known ICs comprising tunnel transistors.

Preferably, the lower step of said two-step profile comprises a further semiconductor material region comprising the second conductive region to improve the drive current of the tunnel transistor.

Such an IC may be integrated in an electronic device, such that the power supply of the electronic device can benefit from the low power consumption of the tunnel transistors.

In an embodiment, the electronic device is a radio-frequency identification (RF-ID) tag further comprising transceiver means coupled to the integrated circuit. Such a tag, which may be a passive tag without a power supply or an active tag including a power supply, benefits from the presence of such an IC because of the ability of its tunnel transistors to combine small sub-threshold slope values with good on-state currents at very low power.

BRIEF DESCRIPTION OF THE EMBODIMENTS

Embodiments of the invention are described in more detail and by way of non-limiting examples with reference to the accompanying drawings, wherein FIG. 1 schematically depicts a prior art tunnel transistor;

FIG. 2a-k schematically depicts the steps of a method for manufacturing a tunnel transistor in accordance with an embodiment of the present invention;

FIG. 3g'-l schematically depicts the steps of a method for manufacturing a tunnel transistor in accordance with another embodiment of the present invention; and FIG. 4 schematically depicts an exemplary electronic device in accordance with a further embodiment of the present invention.

DETAILED DESCRIPTION OF THE DRAWINGS

It should be understood that the Figures are merely schematic and are not drawn to scale. It should also be understood that the same reference numerals are used throughout the Figures to indicate the same or similar parts.

FIG. 2 shows the various steps of a method to manufacture a tunnel transistor in accordance with a preferred embodiment of the present invention. In step (a), a substrate 100 is provided. The substrate 100 may be any suitable silicon-based substrate such as a silicon substrate, a silicon-on-insulator substrate, and may be provided with a buried layer 102, such as a buried N-layer. Such a buried layer 102, if present, may be formed in any suitable way, e.g. by retrograde implantation or by epitaxial growth of the substrate 100. It is noted that such buried layers may be readily formed by the skilled person. For this reason, further discussion on how to form such a buried layer 102 has been omitted for reasons of brevity only.

In step (b), a patterned hard mask 104 is formed by depositing a layer of the hard mask material over the substrate 100 and patterning the material using a lithography step, e.g. a dry or wet etching step. Any suitable hard mask material may be used, such as oxide or nitride based materials, or a carbon-based layer. Such materials may be deposited in any suitable way, such as by chemical vapor deposition (CVD) techniques.

In a next step (c), a trench 106 is formed in the substrate 100 by an etching step. This etching step preferably is an isotropic etching step. Any suitable isotropic etching process may be used, such as the isotropic etching processes commonly used in the formation of FINFETs. As a consequence, a two-step profile is formed in the substrate 100. This two-step profile comprises a higher step which is covered by the hard mask portion 104 and a lower step formed by the trench 106 in the substrate. The higher and lower steps will be used for carrying a drain and source region respectively, as will be explained in more detail later.

In step (d), a sacrificial spacer 108 is formed in a self-aligned fashion on the side wall of the higher step in the two-step profile and the side wall of the hard mask portion 104. Such a spacer may be formed by depositing a layer of the spacer material over the substrate 100 including the hard mask portion and etching back this layer, thereby removing the spacer material from the horizontal surfaces of the surfaces, leaving the spacer 108 against the vertical surface. Suitable materials for the sacrificial spacer 108 include $SiO_2$ and $Si_3N_4$. Other suitable materials may also be used. These materials may be etched using any suitable etching process.

The spacer 108 is to protect the channel region of the tunnel transistor of the present invention from subsequent impurity implant steps.

In step (e), the substrate 100 is subjected to an anisotropic etching step, effectively causing the trenches 106 to be further etched away, thereby forming a source region 110. Such an anisotropic etch may be any suitable anisotropic etch such as a box etch. For instance, an anisotropic etch using a plasma comprising a mixture of HBr, $CF_4$ and $O_2$ may be used. The anisotropic nature of the etch causes the source region 110 to comprise undercut under the spacer 108. Hence, this anisotropic etching step is used to define the source region 110 in the lower step of the aforementioned two-step profile of the tunnel transistor of the present invention. The undercut has the effect of reducing the resistance between the source region 110 and the channel region, and ensures that the gate to be formed will partially overlap the source region 110.

In step (f), a further semiconductor layer 112 is grown in the source region 110 to improve the on-current characteristics of the tunnel transistor. Preferably, Ge or SiGe are used as the further semiconductor material. The layer 112 may be grown in any suitable way, such as for instance an epitaxial growth process in a hydrogen gas atmosphere at a suitable temperature, e.g. 600-800° C. In a preferred embodiment, the further semiconductor layer is grown to a thickness of about 10 nm. It has been found that at this thickness, the significantly improves the on-current of transistor whilst largely avoiding the introduction of defects due to lattice mismatch between the germanium and the silicon substrate 100.

After growing the further semiconductor layer 112, the spacer 108 may be removed using any suitable etching step, as shown in step (g). Suitable etchants may include hot phosphoric acid for a nitride spacer, HF or a mixture of HF, $HNO_3$ and $H_2O_2$ for an oxide spacer. Other example etchants will be apparent to the skilled person. After removal of the spacer, a gate dielectric layer 114 and a gate material layer 116 are deposited over the substrate 100 and the hard mask 104 using suitable deposition steps. Any suitable material may be used for these layers. For instance, the gate dielectric layer 114 may comprise a gate oxide layer such as $SiO_2$ or a high-k dielectric material, whereas the gate material layer 116 may comprise a poly-Si layer, or a suitable metal layer. It is expected that the combination of a suitable high-k dielectric and a metal gate material are particularly beneficial due to favorable electrostatic properties and the controllability of the threshold voltage of the transistor by choosing a metal having an appropriate work function.

As shown in step (h), the gate dielectric layer 114 and the gate material layer 116 are subsequently etched back in a self-aligned manner such that these layers are removed from the horizontal surfaces of the substrate 100, thus yielding the inverted L-shaped gate structure 118. For instance, the gate material may be poly-Si, with the gate material layer 116 having a substantially higher thickness than the gate dielectric layer 114, such that the desired profile may be achieved using an etchant suitable for etching the poly-Si.

A highly anisotropic dry etch may be used to etch away the poly-Si, leaving behind what is effectively a poly-Si spacer against the vertical wall of the two-step profile. The exposed gate dielectric material 114, i.e. on the horizontal surfaces on the stepped profile may subsequently be removed using any suitable etching step such as a wet etch. In case of a metal gate, any suitable anistropic etch for forming the metal spacers against the vertical wall of the two-step profile may be used.

Next, a p-type impurity is implanted in the further semiconductor layer 112 to form a conductive region 120, i.e. a $p^+$ source region, in the lower step of the two-step profile of the tunnel transistor. Any suitable p-type impurity, such as boron, e.g. $BF_2$, may be used. This is shown in step (i). The impurity may be implanted using any suitable implantation energy, e.g. 0-25 keV, at any suitable concentration. The hard mask 104 protects the higher step of the two-step profile from becoming contaminated by this implant.

After this implanting step, the hard mask 104 is removed using suitable etchants. These may be similar etchants as used for the removal of the sacrificial spacer 108, as previously discussed. Spacers 122 are subsequently formed on either side of the gate structure 118. This is shown in step (j). The spacers 122 may be formed similar to the formation of the spacer 108, i.e. by deposition of a layer of the spacer material followed by an etching step in which the spacer material is removed from the horizontal surfaces of the substrate, thus yielding the spacers 122 against the vertical walls of the gate structure 118 in a self-aligned manner.

The tunnel transistor is completed by an angled, i.e. tilted implant of an n-type impurity, thereby forming a conductive region, i.e. the $n^+$ drain region, 124 in the higher step of the two-step profile tunnel transistor, as shown in step (k). Suitable n-type impurities include phosphor and arsenic. The concentration of the n-type impurity may be similar to the concentration of the p-type impurity of the source region at the lower step of the two-step profile. The implant of the n-type impurity is tilted such that the gate structure 118 effectively shields the lower level p-type source region 120 from contamination with the impurity of the opposite conductivity type, i.e. the n-type impurity. It will be appreciated that the suitable tilt angle of the implanting step will depend on device dimensions, e.g. the height of the gate structure 122.

Consequently, a p-i-n structure is formed in which the source region 120 is formed in the lower step of the two step profile, the drain region 124 is formed in the higher step of the two-step profile and the channel region essentially has an inverted L-shape connecting the lower step source region 120 with the higher step drain region 124. In case of the presence of a buried N-layer 102, the $n^+$ drain region 124 may extend to the buried N-layer 102 in order to form a reverse polarized $p^+/n^+$ structure, which has the benefits of a further reduced off-state current. This can be understood as follows. In the off-state, a positive voltage is applied to the n+ drain region 124. This has the effect of polarizing the reverse region of the vertical $n^+/p^+$ diode, leading to an extremely low off-state current. A similar benefit is achieved when the substrate 100 is a silicon-on-insulator substrate, which has the advantage of not requiring the additional buried layer implanting step.

At this point, it should be appreciated that the tunnel transistor of FIG. 2 may be formed using a single mask only, which is the mask to form the patterned hard mask 102, such that the overall cost to manufacture the two-step tunnel transistor of the present invention is significantly lower than the manufacturing cost of prior art tunnel transistors. Moreover, because this manufacturing process does not suffer from mask misalignment problems, shorter channels may be achieved, thus facilitating the provision of an IC having an increased device density.

In addition, it should be appreciated that some of the steps shown in FIG. 2 may be omitted without departing from the teachings of the present invention. For instance, the further semiconductor layer 112 may be omitted, with the p-type source region 120 being formed in the silicon substrate instead. In such an embodiment, the anisotropic etching step to further etch away the trenches 106 may be omitted from the above described process flow.

In case no further semiconductor layer 112 is formed, the formation of the sacrificial spacer 108 may also be omitted.

Although FIG. 2 depicts the formation of a p-i-n tunnel transistor having a p⁺-type drain 120 and an n⁺-type source 124, it will be appreciated that a complementary tunnel transistor having a n⁺-type drain 120 and an p⁺-type source 124 is equally feasible. It will be understood that for such a complementary device, a buried layer 102, if present, would be of a p-type.

It is reiterated that the method depicted in FIG. 2 comprises the preferred embodiment of the present invention. However, it will be understood that variations in the manufacturing process are feasible without departing from the scope of the present invention. For instance, additional masks may be used to form the tunnel transistor of the present invention. An example of such an alternative manufacturing method is shown in FIG. 3.

Figure 3:
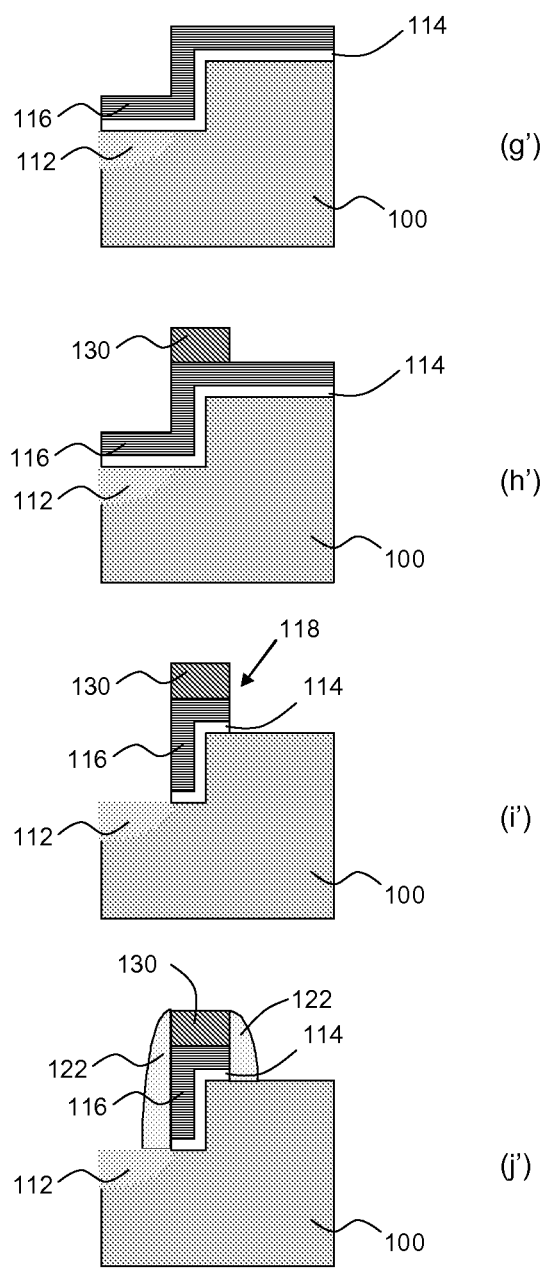
Figure 3:
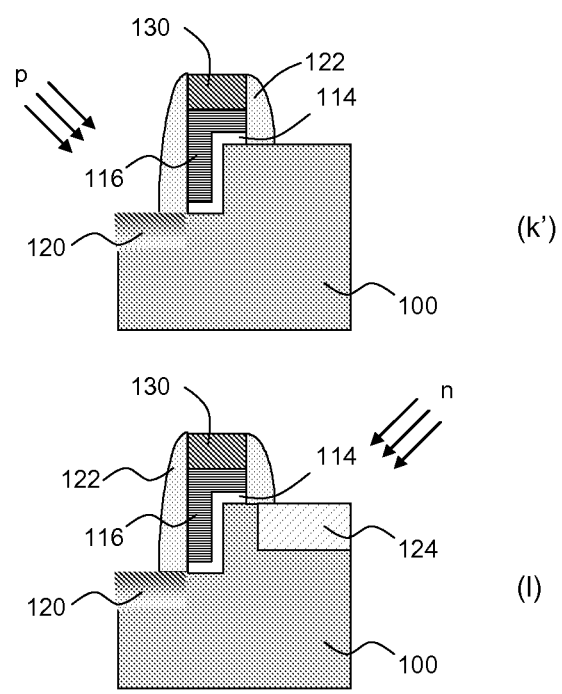

FIG. 3 follows the manufacturing steps of FIG. 2 up to and including step (f) as described above. In FIG. 3, the buried layer 102 has been omitted to visualize that the presence of such a layer is optional. The method shown in FIG. 3 deviates from the method shown in FIG. 2 after the formation of the further semiconductor layer 112 in step (f). Following step (f) of FIG. 2, the spacer 108 and the hard mask 104 are both removed prior to the deposition of the gate dielectric layer 114 and the gate material layer 116, as shown in step (g'). The deposition of these layers is followed by the deposition of a further hard mask layer, which is subsequently patterned to form a further hard mask portion 130, which is used to define the dimensions of the gate to be formed, as shown in step (h').

Following the patterning of the further hard mask, the gate dielectric layer 114 and the gate material layer 116 are removed from the exposed parts of the substrate 100, i.e. those parts not covered by the further hard mask portion 130, thus yielding the gate structure or gate stack 118 shown in step (i'). It will be apparent that the channel formed under this gate has an inverted 'Z'-structure instead of the inverted 'L'-structure of FIG. 2. However, the patterned further mask portion 130 may alternatively be dimensioned such that it yields an inverted 'L'-shaped channel under the gate. It will be understood that the gate of the tunnel transistor of the present invention is a gate formed on the lower step of the two-step profile that at least fully covers the side wall of the higher step of the two-step profile such that an inversion region extending from the source region 124 to the drain region 120 may be formed in the channel under the gate 120 when applying an appropriate voltage to the gate 120.

Next, the spacers 122 are formed on the vertical walls of the gate structure 118, as previously described. This is shown in step (j'). Next, the p-type impurity to form the p⁺-source region 120 is implanted using a tilted implant step, with the gate structure 118 shielding the higher step of the two-step profile from becoming contaminated with the p-type impurity, as shown in step (k'). This is followed by an tilted implant of the n-type impurity to form the n⁺-drain region 124, with the gate structure 118 shielding the lower step of the two-step profile from becoming contaminated with the n-type impurity, as shown in step (l). It will be appreciated that step (k') and l may be interchanged without departing from the scope of the present invention.

The tunnel transistor of the present invention may be completed using conventional back-end processing steps, e.g. planarization and metallization steps.

At this point, it is noted that an electronic device comprising an IC comprising tunnel transistors manufactured in accordance with the method of the present invention will benefit from the fact that such an IC is capable of producing good on-state currents whilst exhibiting a steep sub-threshold slope and very small off-state currents. In addition, because a tunnel transistor may exhibit a very low threshold voltage, these ICs are particularly suitable for integration in electronic devices that are operable in ultra-low power domains, e.g. domains in which leakage currents are less than 100 pA, and in which the supply voltage may be as low as 0.6 V or less.

An example of such an electronic device is shown in FIG. 4. The electronic device 400 is an RF-ID tag comprising one or more antennae 410 that are coupled to an analog front end 420, which is coupled to a digital processing IC 440 via a decoding stage 430 and an encoding stage 435. The IC 440 may be an IC comprising tunnel transistors realized in accordance with the method of the present invention. The IC 4409 may be coupled to a memory 450. Other implementations of such an RF-ID tag are of course also feasible. The arrangement of FIG. 4 is merely used as a non-limiting example to demonstrate that an IC manufactured in accordance with the method of the present invention is particularly suitable for use in low power application domains such as near-field communication application domains due to the excellent performance characteristics of its tunnel transistors at such low voltages.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A method of manufacturing a tunnel field effect transistor, comprising:
    forming a two-step profile in a silicon substrate using a patterned hard mask covering a higher steps of said profile;
    forming a gate stack against a side wall of the higher step;
    forming spacers on two sides of the gate stack; and
    implanting a first type impurity in the higher step and an opposite type impurity in a neighboring lower step, such that at least the first type impurity is implanted using an angled implanting step after removing the patterned hard mask
    wherein forming said gate stack comprises:
    depositing a gate dielectric layer over the substrate and the patterned hard mask,
    depositing a further layer for forming a conductive gate over the gate dielectric layer; and
    etching the gate dielectric layer and the further layer to form the gate stack against the side walls of the higher step and the hard mask;
    wherein the opposite type impurity is implanted into the lower step after said gate stack formation; and
    wherein the patterned hard mask is removed after implanting the opposite type impurity and before forming the spacers on the two sides of the gate stack.

2. The method of claim 1, further comprising:
forming a sacrificial spacer against the side wall of the higher step and a side wall of the hard mask following said two-step profile formation;
further etching a lower step next to said sacrificial spacer and subsequently growing a further semiconductor portion on said lower step; and
removing the sacrificial spacer prior to the gate stack formation.

3. The method of claim 2, wherein said further etching step comprises an anisotropic etching step.

4. The method of claim 3, wherein the further semiconductor portion is selected from Ge and SiGe.

5. The method of claim 1, further comprising burying a layer of the first type impurity in the silicon substrate prior to using said hard mask.

6. The method of claim 1, wherein the silicon substrate is a silicon-on-insulator substrate.

7. An integrated circuit comprising a tunnel field effect transistor manufactured according to the method of claim 1.

8. The integrated circuit of claim 7, wherein the integrated circuit is part of an electronic device.

9. The integrated circuit of claim 8, wherein the electronic device is a radio frequency identification (RFID) tag comprising a transceiver coupled to the integrated circuit.

10. A method of manufacturing a tunnel field effect transistor, comprising:
forming a two-step profile in a silicon substrate using a patterned hard mask covering a higher step of said profile;
forming a gate stack against a side wall of the higher step; and
forming spacers on two sides of the gate stack;
wherein the patterned hard mask is removed prior to the gate stack formation, and wherein forming said gate stack comprises:
depositing a gate dielectric layer over the substrate;
depositing a further layer for forming a conductive gate over the gate dielectric layer;
depositing a further hard mask layer over the further layer;
patterning the hard mask layer to define dimensions of the gate stack; and
etching portions of the further layer and the gate dielectric layer that are uncovered by the patterned hard mask,
and wherein a first type impurity is implanted in the higher step and an opposite type impurity is implanted in a neighboring lower step using angled implanting steps after the gate stack is formed.

* * * * *